United States Patent
Cheng et al.

(10) Patent No.: US 6,926,014 B2
(45) Date of Patent: Aug. 9, 2005

(54) METHOD FOR CLEANING A PLASMA CHAMBER

(75) Inventors: Chao-Yun Cheng, Pingjen (TW);
Shin-Jien Kuo, Taipei (TW);
Chih-Chung Chuang, Junghe (TW);
Shu-Feng Wu, Taoyuan (TW)

(73) Assignee: Au Optronics Corp., Hsinchu (TW)

( * ) Notice: Subject to any disclaimer, the term of this patent is extended or adjusted under 35 U.S.C. 154(b) by 0 days.

(21) Appl. No.: 10/444,571

(22) Filed: May 22, 2003

(65) Prior Publication Data

US 2004/0103914 A1 Jun. 3, 2004

(30) Foreign Application Priority Data

Dec. 2, 2002 (TW) ........................................ 91134944 A

(51) Int. Cl.$^7$ .............................................. B08B 9/093
(52) U.S. Cl. ........................ 134/22.18; 134/1.1; 134/21; 134/22.1; 134/26; 134/30; 134/902; 438/905
(58) Field of Search ................. 134/1.1, 21, 22.1, 134/22.18, 26, 30, 902; 438/905; 216/63, 67

(56) References Cited

U.S. PATENT DOCUMENTS

| | | | | |
|---|---|---|---|---|
| 5,356,478 A | * | 10/1994 | Chen et al. | 134/1 |
| 5,817,578 A | * | 10/1998 | Ogawa | 438/714 |
| 6,003,526 A | * | 12/1999 | Lo et al. | 134/1.1 |
| 6,255,222 B1 | * | 7/2001 | Xia et al. | 438/710 |
| 6,569,257 B1 | * | 5/2003 | Nguyen et al. | 134/26 |
| 6,675,816 B2 | * | 1/2004 | Ichijo | 134/1.1 |
| 2002/0074014 A1 | * | 6/2002 | Yeh et al. | 134/1.1 |

OTHER PUBLICATIONS

Runyan, W.R. et al., *Semiconductor Integrated Circuit Processing Technology,* Table 6.7, p. 276 (1990).
Zhuang, Da Ren, *VLSI Fabrication Technology,* Gau Lih Book Co., LTD, 3rd ed., pp. 257–258, 281–282, and 287 (1997).

* cited by examiner

Primary Examiner—M. Kornakov
(74) Attorney, Agent, or Firm—Ladas & Parry LLP

(57) ABSTRACT

A method for cleaning a plasma chamber after metal etching. First, a substrate having a metal layer thereon is placed in a plasma chamber. Next, the metal layer is etched. Finally, the substrate is removed from the plasma chamber to perform a dry cleaning which includes the following steps. First, the inner wall of the plasma chamber is cleaned by plasma etching using oxygen as a process gas. Next, the top and bottom electrode plates in the plasma chamber are cleaned by plasma etching using chlorine and boron chloride as process gases. Next, the inner wall of the plasma chamber is cleaned again by plasma etching using sulfur hexafluoride and oxygen as process gases. Finally, oxygen and helium used as purging gases are injected into the plasma chamber and exhausted from therein.

26 Claims, 1 Drawing Sheet

METHOD FOR CLEANING A PLASMA CHAMBER

BACKGROUND OF THE INVENTION

1. Field of the Invention

The invention relates to a semiconductor plasma chamber, and more particularly, to a method for dry cleaning a plasma chamber after metal etching to extend the preventive maintenance (PM) cycle.

2. Description of the Related Art

Since metal layers patterned by a plasma processing (dry etching) process offers better critical dimension control than conventional wet chemical etching in the fabrication of microelectronic devices, plasma etching technology is widely applied in the semiconductor and thin film transistor-liquid crystal display (TFT-LCD) industry. Dry etching injects process gas into a chamber having radiation frequency (RF) power, thereby forming RF plasma to serve as an etchant.

During dry etching in the plasma chamber, some etching by-products are deposited on the inner wall of the chamber. When the thickness of deposited etching by-products reaches a certain thickness, the by-products may peel off the inner wall and contaminate the chamber. For example, in the fabrication of a TFT-LCD array, the gate line material is a molybdenum-aluminum-neodymium (MoAlNd) alloy. The MoAlNd alloy layer is etched by a plasma etching process employing chlorine ($Cl_2$) and boron chloride ($BCl_3$) as process gases. In such a process gases easily react with the photoresist pattern layer over the metal layer, forming carbon, aluminum, and molybdenum-containing photoresist residues and aluminum-based compounds, such as aluminum-based chloride ($AlCl_3$), to be deposited on the inner wall of the chamber. The etching by-products deposited on the inner wall of the chamber reduces process stability. That is, the residue may peel off the inner wall of the chamber and fall onto the glass substrate, causing irreparable defects, such as gate line short. Accordingly, it is important to remove such deposited etching by-products.

The conventional method for cleaning the plasma chamber is to open the chamber and then disassemble the components therein. Thereafter, the etching by-products are removed by a physical or chemical method. For example, using deionized water (DIW) and isopropanol (IPA) to clean the components and inner wall of the chamber. However, such a wet cleaning approach is time-consuming and shortens the preventive maintenance (PM) cycle, resulting in the disadvantage of reduced throughput.

SUMMARY OF THE INVENTION

Accordingly, an object of the present invention is to provide a method for cleaning a plasma chamber after metal etching, which uses different process gases to form plasmas in-situ, to clean the plasma chamber, thereby reducing by-products deposited on the inner wall of the plasma chamber, thus extending the preventive maintenance cycle, reducing cleaning time, and increasing throughput.

According to one aspect of the present invention, a method for cleaning a plasma chamber after metal etching includes the following steps. First, a substrate having a metal layer thereon is placed in a plasma chamber. Next, the metal layer is etched. Finally, the substrate is removed from the plasma chamber to perform dry cleaning. The drying cleaning process includes the following steps. First, the inner wall of the plasma chamber is cleaned by performing a first plasma etching. Next, the top and bottom electrode plates in the plasma chamber are cleaned by performing a second plasma etching. Next, the inner wall of the plasma chamber is cleaned again by performing a third plasma etching. Finally, a purging gas is injected into the plasma chamber and exhausted therefrom.

Moreover, the first plasma etching is performed using oxygen as a process gas under a low pressure of about 3 to 10 mTorr and a high pressure of about 15 to 40 mTorr in sequence, wherein the flow rate of the process gas is about 600 to 800 sccm. The second plasma etching is performed using chlorine and boron chloride as process gases under a pressure of about 3 to 6 mTorr, wherein the flow rate of chlorine is about 100 to 500 sccm and that of boron chloride is about 50 to 150 sccm. The third plasma etching is performed using sulfur hexafluoride and oxygen as process gases under a pressure of about 50 to 70 mTorr, wherein the flow rates of sulfur hexafluoride and oxygen are about 600 to 800 sccm, respectively.

Moreover, the purging gas is a mixture of oxygen and helium and the flow rates of oxygen and helium are about 800 to 1000 sccm, respectively.

DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1:
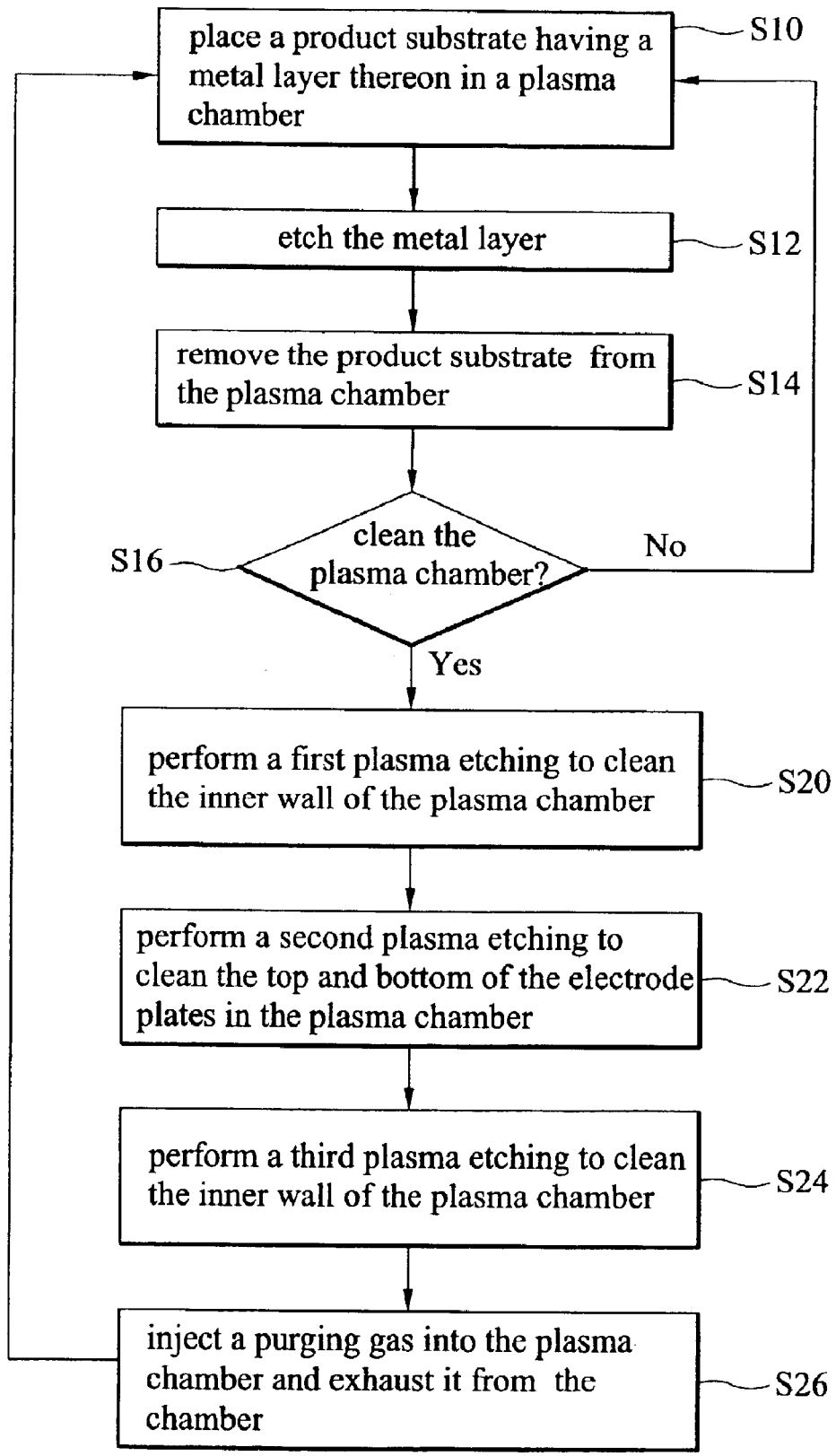
FIG. 1 is a flow diagram showing a method for cleaning a plasma chamber after metal etching according to the present invention.

FIG. 1 shows the inventive method of cleaning a plasma chamber after metal etching for TFT-LCD array fabrication. First, in step S10, a product substrate having a metal layer thereon for fabricating gate lines is provided. In the invention, the product substrate can be a glass substrate and the metal layer can be a molybdenum-aluminum-neodymium (MoAlNd) alloy layer. Next, a photoresist pattern layer is formed on the metal layer by conventional lithography for subsequently defining the gate line pattern. Thereafter, the product substrate is placed in a plasma chamber, such as an inductively coupled plasma (ICP) chamber.

Next, in step S12, the metal layer on the product substrate is etched by inductively coupled plasma using the photoresist pattern layer as a mask to complete the fabrication of gate lines.

Next, in step S14, the product substrate is removed from the plasma chamber. Thereafter, in step S16, the operator determines whether or not the plasma chamber requires cleaning. Step S10 proceeds with the product fabrication if the chamber does not require cleaning. To the contrary, if the chamber requires cleaning, in-situ dry cleaning is performed. The in-situ dry cleaning includes the following steps. First, in step S20, a first plasma etching is performed in the plasma chamber to clean the inner wall of the plasma chamber. In the invention, the first plasma etching can be performed using oxygen ($O_2$) with a flow rate between 600 to 800 sccm, with 800 sccm preferred, as a process gas. Oxygen is used as the process gas to remove carbon-containing by-products that remain after metal etching. Moreover, the carbon-containing by-products in the lower portion of the plasma chamber can be effectively removed by oxygen plasma under a low pressure while by-products in the upper portion of the plasma chamber can be effectively removed by oxygen plasma under a high pressure. Accordingly, the working pressure is first maintained in a range between 3 to 10 mTorr, with 5 mTorr being preferred. Thereafter, the working pressure is increased to a range between 15 to 40 mTorr, with 20 mTorr being preferred.

In step S22, a second plasma etching is performed in the plasma chamber to clean the top and bottom electrode plates in the plasma chamber. In the invention, the second plasma etching can be performed using chlorine ($Cl_2$) and boron chloride ($BCl_3$) as process gases wherein the flow rate of chlorine is about 100 to 500 sccm, and 400 sccm is preferred. Moreover, the flow rate of boron chloride is between 50 to 150 sccm, with 100 sccm being preferred. Chlorine and boron chloride are used as the process gases to remove aluminum-containing by-products after metal etching. In addition, the working pressure is in a range between 3 to 6 mTorr, with 4 mTorr being preferred.

In step S24, a third plasma etching is performed in the plasma chamber to clean the inner wall of the plasma chamber again. In the invention, the third plasma etching can be performed using sulfur hexafluoride ($SF_6$) and oxygen as process gases wherein the flow rate of sulfur hexafluoride is about 600 to 800 sccm, with 800 sccm being preferred. Moreover, the flow rate of oxygen is between 600 to 800 sccm, with 800 sccm being preferred. Sulfur hexafluoride and oxygen are used as process gases to remove neodymium-containing and carbon-containing by-products after metal etching. In addition, the working pressure is in a range between 50 to 70 mTorr, with 60 mTorr being preferred.

In step S26, a purging gas, such as a mixture of oxygen and helium (He), is injected into the plasma chamber for 20 to 40 seconds, with 30 seconds being preferred. Moreover, the flow rates of the sulfur hexafluoride and oxygen are between 800 to 1000 sccm, respectively, with 1000 sccm being preferred. During injection of the purging gas into the plasma chamber, the purging gas containing etching by-products as mentioned above is simultaneously exhausted from the chamber by a pump to complete the dry cleaning method of the invention. Thereafter, the process returns to step S10 for other product fabrication.

According to the present invention, the in-situ dry cleaning method is performed by injecting cleaning gases (process gases) during plasma cleaning, so as to react with the etching by-products to form volatilizable matter, which is then removed by the purging gas. As compared with the wet chemical etching of the prior art, the cleaning of the invention can be performed without opening the chamber. Accordingly, the cleaning time can be reduced, thus reducing fabrication time and contaminants are prevented from entering the chamber. Moreover, since the etching by-products deposited on the inner wall of the plasma chamber are reduced, the preventive maintenance cycle can be extended to increase throughput.

While the invention has been described by way of example and in terms of the preferred embodiments, it is to be understood that the present invention is not limited to the disclosed embodiments. Instead, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method for cleaning a plasma chamber, comprising:
    performing a first plasma etching in the plasma chamber to clean the inner wall of the plasma chamber with oxygen plasma;
    performing a second plasma etching, after the first plasma etching, in the plasma chamber to clean the top and bottom of the electrode plates in the plasma chamber with chlorine and boron chloride plasma; and
    performing a third plasma etching, after the second plasma etching, in the plasma chamber to clean the inner wall of the plasma chamber with sulfur hexafluoride and oxygen plasma.

2. The method as claimed in claim 1, further comprising injecting a purging gas into the plasma chamber and exhausting from therein.

3. The method as claimed in claim 2, wherein the purging gas is injected for about 20~40 sec.

4. The method as claimed in claim 2, wherein the purging gas is a mixture of oxygen and helium and the flow rates of oxygen and helium are about 800~1000 sccm, respectively.

5. The method as claimed in claim 1, wherein the flow rate of oxygen for the first plasma etching is about 600~800 sccm.

6. The method as claimed in claim 5, wherein the first plasma etching is performed under a pressure of about 3~10 mTorr.

7. The method as claimed in claim 5, wherein the first plasma etching is performed under a pressure of about 15~40 mTorr.

8. The method as claimed in claim 1, wherein the flow rates of the chlorine and boron chloride for the second plasma etching are about 100~500 sccm and 50~150 sccm, respectively.

9. The method as claimed in claim 8, wherein the second plasma etching is performed under a pressure of about 3~6 mTorr.

10. The method as claimed in claim 1, wherein the flow rates of sulfur hexafluoride and oxygen for the third plasma etching are about 600~800 sccm, respectively.

11. The method as claimed in claim 10, wherein the third plasma etching is performed under a pressure of about 50~70 mTorr.

12. A method for cleaning a plasma chamber after metal etching, comprising:
    placing a substrate having a metal layer thereon in a plasma chamber;
    etching the metal layer;
    removing the substrate from the plasma chamber; and
    performing a dry cleaning in the plasma chamber, wherein the dry cleaning comprises:
    performing a first plasma etching in the plasma chamber to clean the inner wall of the plasma chamber with oxygen plasma;
    performing a second plasma etching, after the first plasma etching, in the plasma chamber to clean the top and bottom of the electrode plates in the plasma chamber with chlorine and boron chloride plasma; and
    performing a third plasma etching, after the second plasma etching, in the plasma chamber to clean the inner wall of the plasma chamber with sulfur hexafluoride and oxygen plasma.

13. The method as claimed in claim 12, wherein the dry cleaning further comprises injecting a purging gas into the plasma chamber and exhausting from therein.

14. The method as claimed in claim 13, wherein the purging gas is injected for between 20~40 seconds.

15. The method as claimed in claim 14, wherein the purging gas is a mixture of oxygen and helium and the flow rates of oxygen and helium is between 800~1000 sccm, respectively.

16. The method as claimed in claim 12, wherein the metal layer is a molybdenum-aluminum-neodymium (MoAlNd) alloy layer.

17. The method as claimed in claim 16, wherein the flow rate of oxygen for the first plasma etching is between 600~800 sccm.

18. The method as claimed in claim 17, wherein the first plasma etching is performed under a first pressure between 3~10 mTorr.

19. The method as claimed in claim 17, wherein the first plasma etching is performed under a second pressure between 15~40 mTorr.

20. The method as claimed in claim 16, wherein the flow rates of the chlorine and boron chloride for the second plasma etching are about 100~500 sccm and 50~150 sccm, respectively.

21. The method as claimed in claim 20, wherein the second plasma etching is performed under a pressure between 3~6 mTorr.

22. The method as claimed in claim 16, wherein the flow rates of sulfur hexafluoride and oxygen for the third plasma etching are about 600~800 sccm, respectively.

23. The method as claimed in claim 22, wherein the third plasma etching is performed under a pressure between 50~70 mTorr.

24. A method for cleaning a plasma chamber, comprising:

performing a first plasma etching in the plasma chamber to clean the inner wall of the plasma chamber with a first oxygen-based plasma;

performing a second plasma etching, after the first plasma etching, in the plasma chamber to clean the top and bottom of the electrode plates in the plasma chamber with a chlorine and boron chloride-containing plasma; and performing a third plasma etching, after the second plasma etching, in the plasma chamber to clean the inner wall of the plasma chamber with a second oxygen-based plasma other than the first oxygen-based plasma.

25. The method as claimed in claim 24, wherein the first oxygen-based plasma is oxygen plasma.

26. The method as claimed in claim 24, wherein the second oxygen-based plasma is sulfur hexafluoride and oxygen-containing plasma.

* * * * *